US006719388B2

(12) United States Patent
Becerra et al.
(10) Patent No.: US 6,719,388 B2
(45) Date of Patent: Apr. 13, 2004

(54) FAIL-SAFE CIRCUIT FOR DYNAMIC SMARTPOWER INTEGRATED CIRCUITS

(75) Inventors: Juan J. Becerra, Voorheesville, NY (US); William G. Hawkins, Webster, NY (US); Christopher R. Morton, Rochester, NY (US); Yungran Choi, Webster, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/683,530

(22) Filed: Jan. 16, 2002

(65) Prior Publication Data

US 2003/0132976 A1 Jul. 17, 2003

(51) Int. Cl.[7] .................... H03K 19/007; H03K 19/096; B41J 29/38

(52) U.S. Cl. ............................... 347/9; 326/14; 326/95; 326/98

(58) Field of Search ............................. 326/14, 95, 98; 347/9

(56) References Cited

U.S. PATENT DOCUMENTS

| | | | | | |
|---|---|---|---|---|---|
| 3,873,893 | A | * | 3/1975 | Bianchini | 361/197 |
| 3,955,125 | A | * | 5/1976 | Butler et al. | 361/197 |
| 4,001,819 | A | * | 1/1977 | Wise | 340/521 |
| 4,199,727 | A | * | 4/1980 | Barnes | 307/650 |
| 4,322,634 | A | * | 3/1982 | Kaire et al. | 327/545 |
| 4,344,157 | A | * | 8/1982 | White et al. | 365/222 |
| 4,716,551 | A | * | 12/1987 | Inagaki | 365/222 |
| 4,774,530 | A | | 9/1988 | Hawkins | |
| 4,789,874 | A | * | 12/1988 | Majette et al. | 250/231.1 |
| 4,853,718 | A | * | 8/1989 | ElHatem et al. | 324/672 |
| 4,933,908 | A | * | 6/1990 | Byers et al. | 365/222 |
| 5,172,130 | A | * | 12/1992 | Takahashi | 347/13 |
| 5,323,354 | A | * | 6/1994 | Matsumoto et al. | 365/229 |
| 5,359,237 | A | * | 10/1994 | Pye | 327/95 |
| 5,371,530 | A | * | 12/1994 | Hawkins et al. | 347/57 |
| 5,392,251 | A | * | 2/1995 | Manning | 365/222 |
| 5,404,335 | A | * | 4/1995 | Tobita | 365/222 |
| 5,517,454 | A | * | 5/1996 | Sato et al. | 365/222 |
| 5,587,672 | A | * | 12/1996 | Ranganathan et al. | 326/93 |
| 5,774,166 | A | * | 6/1998 | Kazuyuki | 347/248 |
| 5,975,668 | A | * | 11/1999 | Fujii et al. | 347/10 |
| 6,137,509 | A | * | 10/2000 | Hayasaki | 347/180 |
| 6,151,050 | A | * | 11/2000 | Hosono et al. | 347/10 |
| 6,166,980 | A | * | 12/2000 | Chun | 365/222 |
| 6,217,159 | B1 | * | 4/2001 | Morikoshi et al. | 347/10 |
| 6,320,406 | B1 | * | 11/2001 | Morgan et al. | 326/14 |
| 6,328,401 | B1 | * | 12/2001 | Kuronuma et al. | 347/15 |
| 6,328,410 | B1 | * | 12/2001 | Kawase et al. | 347/23 |
| 6,419,338 | B1 | * | 7/2002 | Ikeda | 347/14 |

* cited by examiner

*Primary Examiner*—Stephen D. Meier
*Assistant Examiner*—Leonard Liang
(74) *Attorney, Agent, or Firm*—Oliff & Berridge, PLC

(57) ABSTRACT

A method and Apparatus for protection of semiconductor micromechanical devices that use circuits with dynamic logic addressing is disclosed. In one exemplary embodiment of the invention, a fail-safe circuit is provided for an ink jet print head integrated circuit which prevents a catastrophic consequence of the dynamic logic addressed integrated circuit losing its charge.

19 Claims, 4 Drawing Sheets

FAIL-SAFE CIRCUIT FOR DYNAMIC SMARTPOWER INTEGRATED CIRCUITS

BACKGROUND OF THE INVENTION

1. Field of Invention

This present invention relates to a method and apparatus for creating fail-safe electrical components that employ dynamic logic circuitry to switch large power loads or to otherwise control circuits.

2. Description of Related Art

A thermal ink jet print head selectively ejects droplets of ink from a plurality of drop ejectors. The ejectors are operated in accordance with digital instructions to create a desired image on an image receiving member. The print head may move back and forth relative to the image receiving member to print the image in swaths or the print head may extend across the entire width of an image receiving member, to print the image without any scanning motion.

The ejectors typically comprise capillary channels, or other ink passageways, which are connected to one or more common ink supply manifolds. Ink is retained within each channel until, in response to an appropriate digital signal, the ink in the channel is rapidly heated and vaporized by a heating element disposed on a surface within a channel. This rapid vaporization of the ink adjacent the channel creates a bubble which causes a quantity of ink to be ejected through an opening associated with the channel to the print sheet. One patent showing the general configuration of a typical ink jet print head is U.S. Pat. No. 4,774,530, incorporated herein by reference in its entirety.

Within a device, such as a thermal ink jet print head, where control circuitry is used to control heating elements, an important design concern is the difference in voltage, and thus power, between the digital logic circuits used to fire the ejectors and the power circuits used to heat the ink or other fluids. In a typical thermal ink jet print head, for example, the digital logic signals which are used to activate particular ejectors at particular times to print an image typically operate at about 5 volts and the trend is to move to 3.3 V addressing logic. In particular, these relatively low voltage logic addressing circuits are used to switch drive transistors that turn on heating elements. In contrast, the heating elements typically require voltages in the range of 30 to 50 volts in order to provide the desired phase transformation of the liquid ink adjacent the heating element. In the case where it is desired to use lower voltages to operate the heating elements, more current is required, since joule heating is being employed.

Thermal ink jet print heads typically use integrated circuits which have large arrays of power transistors and associated heating elements, where only a subset of power transistors are to be switched on simultaneously. Typically, the heater element array is sequentially fired because the current draw per element is very large and activating all channels together could lead to rapid failure of the chip from over heating. Additionally, the firing order of the heating elements is frequently a ripple fire pattern and the shape of the heating pulses applied to each heater element is often complex and may be a function of the temperature of the print head. Finally, the increased resolution of inkjet print heads means that the amount of logic required to address at high resolution of inkjet print heads means that the amount of logic required to address at high resolution is increased. Accordingly, the logic circuits used to selectively address the power transistors have become increasingly complicated. To reduce the cost of this addressing logic and to reduce the area consumed by the addressing logic, dynamic, rather than static, logic circuits are used. Dynamic circuit elements retain information by storing charge. However, the charge is always leaking away from the dynamic circuit element storage nodes. The hold time of a dynamic circuit element is defined as the maximum amount of time before there is sufficient loss of stored charge such that the logic state of the circuitry becomes undefined. In many cases, the loss of stored charge is different for logic gates in the "1" state versus the "0" state so the output of the circuit is truly undefined. This may also be described as a "loss of state."

To prevent the loss of state, most systems require that the dynamic circuit elements must be refreshed in a time period that is less than the hold time of the dynamic circuit elements. If for some reason, such as a loss of connection to power, or time-dependent logic failures, the refresh event does not occur before the dynamic circuit elements lose state, then faulty circuit operation will occur.

SUMMARY OF THE INVENTION

In integrated circuits, such as thermal ink jet chips, which have large arrays of power transistors, where only a subset of power transistors are to be enabled simultaneously, the loss of state can cause a high current condition which can melt the interconnections between the chip and the power supply, if not the chip itself. A fuse in the system will not react as fast as the chip, and at a minimum the chip will be destroyed. In the case where a fuse is blown by excessive current flow, it is still necessary to replace the fuse to regain proper operation of the circuit. Thus, there is a need in thermal ink jet print heads to provide protection for this circuitry. It would be most desirable if the protection circuit was truly fail-safe i.e., such that the circuit and the component are still fully usable after the event.

This invention provides systems and methods that reduce the likelihood that a catastrophic consequence of a dynamic circuit losing state will occur.

This invention separately provides a dynamic fail safe circuit that reduces the likelihood that a catastrophic consequence will occur upon one or more dynamic circuit elements losing state.

This invention separately provides methods for determining a safety factor hold time for a dynamic fail-safe circuit.

This invention separately provides a dynamic fail-safe circuit that is locatable in close proximity to the dynamic circuit elements to be protected against consequences from losses of state.

This invention further provides a dynamic fail safe circuit that, by being located in close proximity to the dynamic circuit elements to be protected, will experience substantially the same process variations as the protected dynamic circuit elements.

In various exemplary embodiments, the systems and methods according to this invention protect dynamic circuit elements against the catastrophic effects of loss of state by providing a dynamic fail-safe circuit. This dynamic fail-safe circuit is refreshed at the same clock rate as the protected dynamic circuit elements. However, this dynamic fail-safe circuit has a hold time that is less than the hold time of the protected dynamic circuit elements, but more than the nominal refresh time. Thus, if the refresh signal is disrupted sufficiently that the protected dynamic circuit elements lose state, the dynamic fail-safe circuit will have previously exceeded its hold time, such that the dynamic fail-safe circuit is placed into a protection mode that protects the protected dynamic circuit elements from experiencing one or more catastrophic effects that would otherwise be experienced after the protected dynamic circuit elements lose state.

In various exemplary embodiments, the dynamic fail-safe circuit includes a dynamic latch. Under normal operation, the dynamic latch is maintained by the refresh signal in a first state that allows the integrated circuit containing the protected dynamic circuit elements to operate normally. When the dynamic latch is not refreshed within its fail-safe hold time, the dynamic latch reverts to a second state that protects the protected dynamic circuit elements.

In various exemplary embodiments, the dynamic fail-safe circuit also includes a number of AND gates. Each AND gate has an input connected to the dynamic latch, either directly or indirectly. The other input to the AND gate is connected to the dynamic logic circuit. The outputs of the AND gates are connected to a drive transistor array.

In the first state, the output of the dynamic latch is such that, directly or indirectly, a high logic signal is placed on one of the inputs to the AND gates. Thus, the AND gates pass the dynamic logic signal to the drive transistor array. In contrast, in the second state, the output of the dynamic latch is such that a low logic signal is placed on one of the inputs to the AND gates. Thus, the AND gates do not pass the dynamic logic signal to the drive transistors, thereby reducing the chances of a catastrophic consequence.

The hold time of the dynamic latch is selected so that, within a selected safety factor, state, the hold time of the dynamic latch will cause the dynamic latch to shift from the first state to the second state before the dynamic circuit elements lose state.

In various exemplary embodiments, the dynamic latch is formed on the same integrated circuit chip as the protected dynamic circuit elements. Thus, the dynamic latch experiences the same process variations as the protected dynamic circuit elements. These process variations can cause the hold times of the dynamic latch and the protected dynamic circuit elements to vary from the nominal design hold times. Because the dynamic latch and the protected dynamic circuit elements experience substantially the same variations, their hold times will vary in substantially the same way, substantially maintaining the relative values of the hold times.

Other objects, advantages and salient features of the invention will become apparent from the following detailed description taken in conjunction with the attached drawing, which disclose an exemplary embodiment of the invention.

BRIEF DESCRIPTION OF THE DRAWINGS

The invention will be described with reference to the following drawing, wherein.

DETAILED DESCRIPTION OF THE EMBODIMENTS

Figure 1:
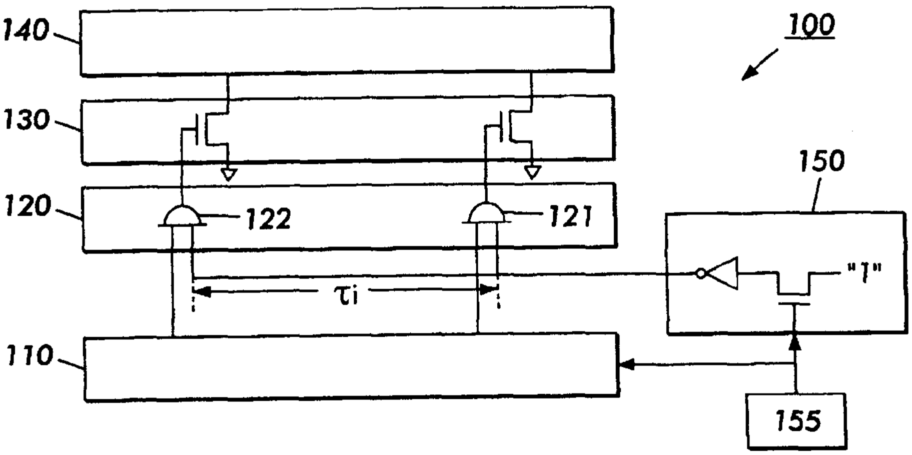
FIG. 1 is a block diagram of a print head circuit according to a first exemplary embodiment of the invention.

Various exemplary embodiments of the circuits and methods according to this invention are described using thermal inkjet print head technology. It should be understood that many other micro-fluidic and micro-mechanical systems can also be addressed by dynamic logic circuitry, and may also have catastrophic states that could be encountered with a "loss of state" in the controlling logic section. All of these types of micro-fluidic and micro-mechanical devices are considered to be within the scope of this invention.

This invention provides a fail-safe circuit which continually monitors the print head circuit refresh event and protects the circuit elements of a circuit that contains one or more dynamic circuit elements when the refresh time $\tau_r$ of one or more of the dynamic circuit elements approaches the hold time $\tau_{hd}$ of the dynamic circuit elements. In one exemplary embodiment of this invention, a dynamic timer circuit is provided which measures the actual refresh time $\tau_{ra}$ and compares it to some maximum allowable limit $\tau_{hf}$. The maximum allowable time limit $\tau_{hf}$ is specified with a margin of safety based upon the expected variation in the hold time of the dynamic circuit elements formed on the integrated circuit chip, and the expected race timing between the dynamic fail-safe circuit and the failing dynamic circuit elements.

The race characterizes the importance of the dynamic fail-safe circuit detecting the failure of the refresh condition and sending its protection signal to the protected circuit elements in a time $\tau_{df}$. To protect the protected circuit elements, the time $\tau_{df}$ must be before at least one of the dynamic logic circuits detects its failure condition and its erroneous state arrives at the protected circuit elements in a catastrophic signal arrival time $\tau_{dd}$.

Further, due to process variations, the timing parameters will vary from the nominal values. These timing parameters are the maximum allowable time limit $\tau_{hf}$, the hold time of the dynamic circuit $\tau_{hd}$, the time to send a protection signal $\tau_{df}$, and the time to detect a failure condition and erroneous state of the dynamic circuit, i.e., the catastrophic signal arrival time $\tau_{dd}$. If these parameters are distributed as a gaussian distribution, then each timing parameter will have a parameter ($\tau$, $\sigma$) associated with the timing parameter which describes the width in the variation in timing of that timing parameter. These are denoted as $\sigma_{hf}$, $\sigma_{hd}$, $\sigma_{df}$, $\sigma_{dd}$.

Finally, if the timer circuit is a centralized function, the arrival time to the most distant protected circuit element will be the longest. In this case, the longest protected circuit interconnect delay time $\tau_l$ is used as an offset term in the delay determination. Additionally, clock skew can be embedded in the delay calculations.

To guarantee that the fail-safe signal protects the protected circuit elements prior to the arrival of the undefined logic output most of the time, the following relationships can be defined:

$$T_{hf}+4\sigma_{hf}+\tau_{df}+4\sigma_{df}+\tau_l<\tau_{hd}-4\sigma_{hd}+\tau_{dd}-4\sigma_{dd}; \text{ and} \quad (1)$$

$$\tau_{hf}<\tau_{hd}-4\sigma_{hd}+\tau_{dd}-4\sigma_{dd}-(4\sigma_{hf}+\tau_{df}+4\sigma_{df}\tau_l). \quad (2)$$

The probability of time-dependent failure is related to the choice of safety margin. The safety margin is thus defined by the number of standard deviations ($\sigma$) used in Equations (1) and (2). The above exemplary embodiment uses four standard deviations ($\sigma$), but more or fewer standard deviations may be used in other exemplary embodiments.

Figure 4:
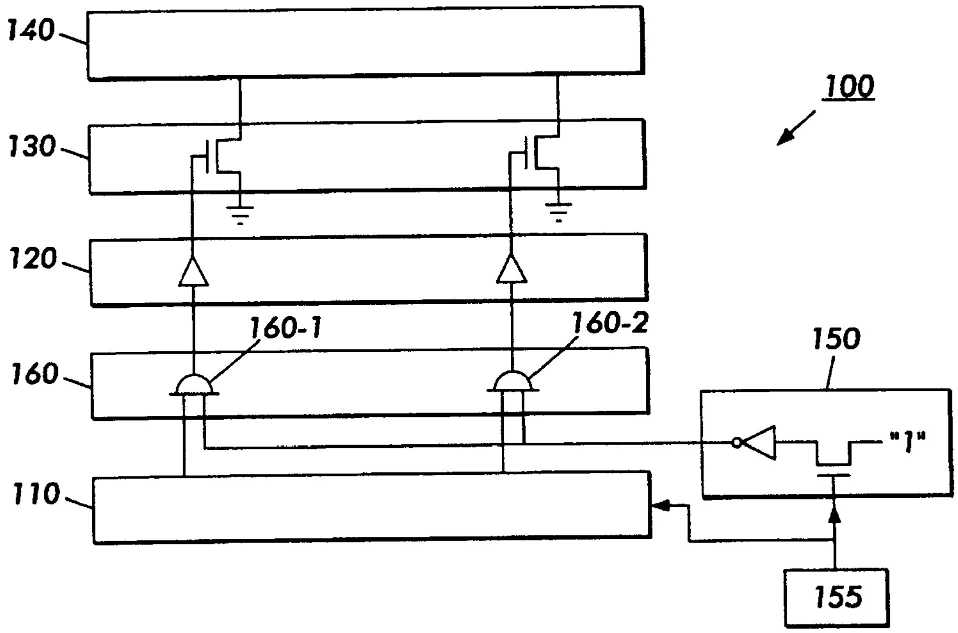
FIG. 4 is a block diagram of a print head circuit according to a second exemplary embodiment of the invention.

FIG. 1 shows a block diagram of one exemplary embodiment of a fail safe circuit according to this invention. As shown in FIG. 1, a fail safe circuit 100 comprises a drop ejector array 140, a drive transistor array 130 and a dynamic logic circuit 110 which provides control signals and/or drive signals to the transistor array 130. A predriver array 120, shown as containing AND gates 121 and 122, is located between the dynamic logic circuit 110 and the drive transistor array 130. The pre-driver array runs off an intermediate voltage and normally acts as an interface between the low voltage logic and the high voltage transistor array. As shown in FIG. 4, the predriver array 120, includes in its circuitry an array of AND gates 160-x.

As shown in FIG. 4, the array of AND gates 160-x, which in this exemplary embodiment are located in predriver array 120, along with a dynamic fail safe timer circuit 150 form a dynamic fail safe circuit 100 according to this invention. A clock 155 outputs a clock signal to both the dynamic fail-safe timer 150 and the dynamic logic circuit 110. The clock signal refreshes the dynamic circuit elements in the dynamic fail-safe time 150 and the dynamic logic circuit 110.

The AND gate array 160, which is shown in FIG. 4, as being included in the pre-driver array 120, includes a plurality of AND gates 160-x, where x is an integer. It should be understood that the AND gate array 160 may be in a separate structure or portion of the fail safe circuit and need not be part of the pre-driver array 120, as shown in FIG. 4. If the AND gate array 160 is located in the pre-driver array 120, the AND gates are typically operated at the relatively high voltage of the pre-driver array. If the AND gate array is located separate from the pre-driver array 120, the AND gates are operated at the relatively low voltage of the dynamic logic array 110. Each AND gate 160-x has one input terminal connected to the dynamic fail-safe timer 150 and one or more input terminals connected to outputs of the dynamic logic circuit. It should be appreciated that only those outputs from the dynamic logic circuit 110 that have a significant probability of causing a catastrophic effect to the protected circuitry of the drive transistor array 130 requires routing through one of the AND gates 161 et al. of the AND gate array 160. However, it is possible that any output signal from the dynamic logic circuit 110 could cause a catastrophic effect on the protected circuitry of the drive transistor array 130. Thus, any or all of the output signals from the dynamic logic circuit 110 may be routed through the AND gate array 160. Similarly, the level of significant probability of catastrophic effect may be determined on a variety of bases such as risk/cost analysis such that the actual output signals routed through the AND gate array 160 can be a design choice.

It should also be appreciated that other types of logic circuit elements, such as other types of logic gates, multiplexers, flip-flops, latches, buffers, tri-slate devices or any other known or later developed logic element, and combinations of one or more of these logic elements, can be used in place of some or all of the AND gates 160-x of the AND gate array 160. Thus, in this case, the AND gate array 160 is more appropriately referred to as a logic element array 160. Therefore, it should be appreciated that each "element" of the logic element array 160 can be any suitable combination of one or more known or later developed logic elements, so long as each such element of the logic element array 160 can react to the state of the signal from the dynamic fail-safe timer circuit 150 to reduce the likelihood of damage to the protected circuit elements form any catastrophic effects of loss of state in the dynamic logic circuit 110.

As shown in FIG. 4, in this exemplary embodiment that uses the AND gate 160-X as the logic elements of the logic element array 160, the logic element array 160 includes a first AND gate 160-1 and a second AND gate 160-2. The AND gate 160-2 is physically located at a position on the print head 10, shown in FIG. 4, closest to the fail-safe timer circuit 150. The first AND gate 160-1 is physically located at a position on the print head 100 farthest from the fail-safe timer circuit 150. An interconnect delay time $\tau_l$ is the time that it takes for the signal from the dynamic fail-safe timer circuit 150 to pass the second AND gate 160-2 and reach the first AND gate 160-1. The AND gate array can be placed in any suitable location in the circuit, including, as shown in FIG. 4, between predriver 120 and dynamic logic circuit/ 110.

As shown in FIG. 4, in various exemplary embodiments, the dynamic fail-safe timer circuit 150 is a dynamic latch which passes a logic "1" only when the period of the clock signal from the clock 155 does not exceed the nominal hold time $\tau_{hf}$ of the dynamic latch used to implement the dynamic fail-safe timer circuit 150. Of course, it should be appreciated that any suitable dynamic circuit, which is capable of outputting a signal to the logic element array 160 whose value is unambiguously based on whether one or more of the dynamic circuit elements of the dynamic fail-safe timer 150 have lost its state, can be used to implement the dynamic fail-safe timer 150. A logic "1" is passed to the pre-driver array 120 as long as the period of the clock signal from the clock 155 does not exceed the normal hold time $\tau_{hf}$ of the timer circuit 150. Moreover, in various exemplary embodiments, the dynamic logic circuit 110 includes one or more dynamic latches as at least a portion of the dynamic circuit elements. In this case, in various exemplary embodiments the dynamic latch of this dynamic fail-safe timer circuit 150 is identical to the dynamic latches in the dynamic logic circuit 110 except for width and length adjustments of the transistors. The widths and length of the transistors forming the dynamic latch used to implement the dynamic fail-safe timer 150 are used to set the maximum allowable limit $\tau_{hf}$ according to a desired safety margin.

In these exemplary embodiments, the nominal fail-safe hold time $\tau_{hf}$ of the fail-safe timer circuit 150 will track very closely with the nominal protected dynamic circuit hold time $\tau_{hd}$, since the circuit elements of the fail-safe timer circuit 150 are substantially similar to the circuit elements that form the dynamic logic 110, i.e., the protected dynamic circuit. Further, due to the physical proximity of the fail-safe timer circuit 150 and the dynamic logic circuit 110, the ratio $\tau_{hf}/\tau_{hd}$ will be nearly constant. Since the circuit delays of the two paths are affected equally by any process variations that occur during fabrication, the margin of safety will remain constant from chip-to-chip, regardless of any process variations. Typical refresh times $\tau_r$ are between about 50 nanoseconds and about 10000 nanoseconds for clock 155. Typical fail safe circuit hold times $\tau_{hs}$ minimum values are about 300 microseconds. Typical dynamic logic hold times $\tau_{hd}$ minimum values are about 600 microseconds. These values assume that $\tau_r<\tau_{hf}<\tau_{hd}$.

Figure 2:
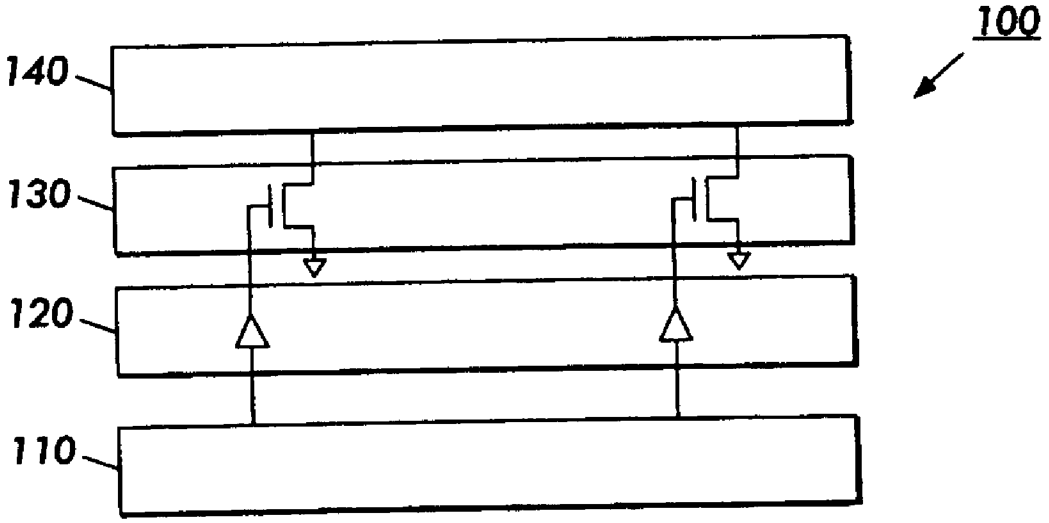
FIG. 2 is a block diagram of a print head circuit without a fail-safe circuit.

FIG. 2 shows a schematic diagram of voltage buffer type print head predrivers without the fail-safe feature of this invention. Without the failsafe feature of this invention, predriver 120 would interface between the dynamic logic circuit 110 and the drive transistor array 130, and predriver 120 would act as a voltage interface between the relatively high operating voltage, of about 40V, of the drive transistor array circuitry 110, and the relatively low operating voltage, of about 5 V, of dynamic logic circuitry 130.

Figure 3:
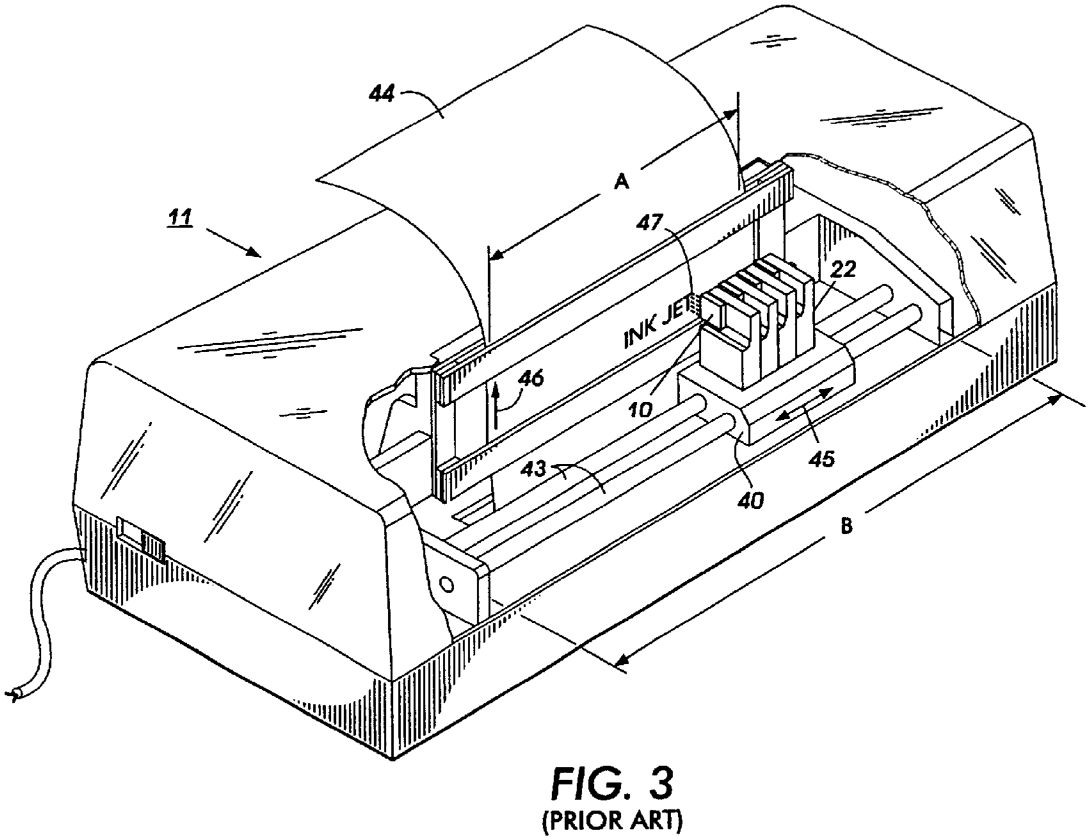
FIG. 3 (PRIOR ART)
FIG. 3 is a block diagram of a printing system which includes the print head circuit of FIG. 1.

FIG. 3 shows a typical multicolor thermal ink jet printer 11, which is disclosed and described in more detail in U.S. Pat Nos. 5,107,276 and 4,571,599, the subject matter of which is incorporated herein by reference. Printer 11 is shown containing several disposable ink supply cartridges 22, each with an integrally attached print head 10. The cartridge and print head combination are removably mounted on a translatable carriage 40. The carriage moves back and forth on for example, one or more guide rails 43 which are parallel to a recording medium 44, as depicted by arrow 45. The recording medium is held stationary while the carriage moves in one direction and, prior to the carriage 40 moving in the reverse direction, the recording medium is stepped in the direction of arrow 46. The droplets are ejected on demand from the nozzles 27 in a front face 29 of the printheads along trajectories 47 to the paper. Each print head has a driver circuit 49, which is controlled by logic controller 58, as shown in FIGS. 5A and 5B of the '276 patent. The fail-safe circuit of this invention may be used, for example, with the print head driver circuit array 49 shown in the '276 patent, the drive transistor array in FIG. 1 of this application being equivalent to the print head driver circuit array 49 in the '276 patent.

While the invention has been described with reference to the structure and method disclosed, it is not confined to the details set forth, but is intended to cover such modifications or changes as may come within the scope of the following claims.

What is claimed is:

1. A dynamic fail-safe circuit usable to reduce a likelihood of damage to a circuit that includes a dynamic logic circuit, the dynamic logic circuit having a particular hold time $\tau_{hd}$ and a nominal refresh time $\tau_r$ shorter than the hold time $\tau_{hd}$, upon the dynamic logic circuit losing state, comprising:

a dynamic timer circuit having a hold time $\tau_{hf}$, where $\tau_r<\tau_{hf}<\tau_{hd}$.

2. A fail safe circuit according to claim 1, further comprising:

at least one printer drop ejector array;

a transistor array to drive the at least one printer drop ejector array; and a fail-safe timer circuit coupled to the dynamic circuit that measures the refresh time $\tau_r$ and enables the transistor array only when the refresh time $\tau_r$ is less than the hold time $\tau_{hf}$.

3. The fail-safe circuit of claim 2, further comprising:

a pre-driver array electrically connected to the dynamic logic circuit and the transistor array.

4. The fail-safe circuit of claim 2, wherein:

a delay time $\tau_{dd}$ exists between the pre-driver array elements associated with the drop ejectors in the drop ejector array that are farthest from each other, and wherein the fail-safe circuit is coupled to the logic circuit and the pre-driver array to generate and send a disable signal to the pre-driver array in a limit time $\tau_{hf}$ which is shorter than the hold time $\tau_{hd}$ and less than the delay time $\tau_{dd}$.

5. The dynamic fail-safe circuit of claim 1, further comprising a logic element array that is electrically connected between the dynamic logic circuit and the circuit array and to the dynamic timer circuit, the logic element array comprising a plurality of logic circuit elements, a state of an output signal from the dynamic timer circuit controllably enabling the logic circuit elements to pass output signals from the dynamic logic circuit to the circuit array.

6. The dynamic fail-safe circuit of claim 5, wherein:

a propagation delay time of a signal from the dynamic timer circuit to a farthest one of the plurality of logic elements of the logic circuitry array is $\tau_l$, and $\tau_r<\tau_{hf}<\tau_{hd}$.

7. A method of protecting a dynamic logic circuit wherein the dynamic logic circuit having a particular hold time $\tau_{hd}$ and a refresh time $\tau_r$ shorter than the hold time $\tau_{hd}$, comprising:

adjusting the dynamic timer circuit having a hold time $\tau_{hf}$, and a maximum allowable hold time $\tau_{hf}$ such that $\tau_r<\tau_{hf}<\tau_{hd}$.

8. A method according to claim 7, wherein the dynamic logic circuit is connected to at least one printer drop ejector array and a transistor array for driving the at least one printer drop ejector array, and further comprising coupling a fail-safe timer circuit to the dynamic circuit to measure the refresh time $\tau_r$ and enable the transistor array only when the refresh time $\tau_r$ is less than the hold time $\tau_{hf}$.

9. A method for protecting an ink jet print head having at least one drop ejector array and a transistor array, comprising:

driving the at least one drop ejector array with a dynamic logic circuit having a particular hold time $\tau_{hd}$ and a refresh time $\tau_r$ shorter than the hold time; and coupling a fail-safe circuit to the dynamic logic circuit, that measures the refresh time $\tau_r$ and enables the transistor array only when the refresh time $\tau_r$ is less than the hold time $\tau_{hd}$.

10. The method of claim 9, further comprising:

connecting a pre-driver array to the dynamic logic circuit and the transistor array.

11. The method of claim 9, wherein:

a delay time exists between the pre-driver array elements associated with the drop ejectors in the drop ejector array that are farthest from each other is $\tau_l$, and further comprising coupling the fail-safe circuit to the logic circuit and the pre-driver array to generate and send a disable signal to the pre-driver array in a disable signal time $\tau_{df}$ which is shorter than the time $\tau_{dd}$ when the transistor array receives a signal indicating loss of state.

12. The method of claim 11, further comprising associating with the disable signal time $\tau_{df}$ a term $\sigma_{df}$ describing a process variation of the disable signal time; and associating with the catastrophic signal arrival time $\tau_{dd}$ a term $\sigma_{dd}$ describing a process variation of the catastrophic signal arrival time $\tau_{dd}$.

13. The method of claim 9, further comprising:

associating with the hold time $\tau_{hd}$ a term $\sigma_{hd}$ describing a process variation of the hold time.

14. A fail-safe circuit for an ink jet print head having at least one drop ejector array;

a transistor array for driving the at least one drop ejector array;

a dynamic logic circuit having a particular hold time $\tau_{hd}$ and a refresh time $\tau_r$ shorter than the hold time; and a fail-safe circuit, coupled to the dynamic logic circuit, that detects the failure of the logic circuit to be refreshed and sends a disable signal to the transistor circuit in a time $\tau_{df}$ before (1) the logic signal detects its failure to be refreshed and (2) a signal indicative of the failure to be refreshed arrives at the transistor array in a time $\tau_{dd}$.

15. A method for protecting an ink jet print head having at least one drop ejector array, a transistor array for driving the at least one drop ejector array, and a dynamic logic circuit having a particular hold time $\tau_{hd}$ and a refresh time $\tau_r$ shorter than the hold time, comprising: p1 detecting the failure of the logic circuit to be refreshed and sending a disable signal to the transistor circuit in a time $\tau_{df}$ before the logic signal detects its failure to be refreshed and a signal indicative of the failure to be refreshed arrives at the transistor array in a time $\tau_{dd}$.

16. A fluid ejection system, comprising:

at least one fluid drop ejector array;

a circuit array that selectively passes drive signals to the at least one fluid drop ejector array;

a dynamic logic circuit that controllably enables circuit elements of the circuit array to selectively pass the drive signals to the at least one fluid drop ejector array and a nominal refresh time $\tau_r$ that is shorter than the hold time $\tau_{hd}$; and the dynamic fail safe circuit of claim 1, wherein the dynamic timer circuit is coupled to the dynamic logic circuit and enables the circuit array only when an actual refresh time $\tau_{ra}$ is less than the hold time $\tau_{hd}$ of the fail-safe timer circuit.

17. The dynamic fail-safe circuit of claim 16, further comprising a logic element array that is electrically connected between the dynamic logic circuit and the circuit array and to the dynamic timer circuit, the logic element array comprising a plurality of logic circuit elements, a state of an output signal from the dynamic timer circuit controllably enabling the logic circuit elements to pass output signals from the dynamic logic circuit to the circuit array.

18. An ink jet printing system including a printer with at least one source of ink, a scanning carriage, substrate feeder and dynamic print head control circuitry, comprising:

the fluid ejection system of claim 16.

19. An ink jet printing system including a printer with at least one source of ink, a scanning carriage, substrate feeder and dynamic print head control circuitry, comprising:

a dynamic fail-safe circuit usable to reduce a likelihood of damage to a circuit that includes a dynamic logic circuit, the dynamic logic circuit having a particular hold time $\tau_{hd}$ and a nominal refresh time $\tau_r$ shorter than the hold time $\tau_{hd}$, upon the dynamic logic circuit losing state with a dynamic timer circuit having a hold time $\tau_{hf}$, where $\tau_r<\tau_{hf}<\tau_{hd}$.

* * * * *